(12) United States Patent
Chen

(10) Patent No.: US 10,050,615 B2
(45) Date of Patent: Aug. 14, 2018

(54) OVER-VOLTAGE PROTECTION CIRCUIT AND ASSOCIATED METHOD

(71) Applicant: Chengdu Monolithic Power Systems Co., Ltd., Chengdu (CN)

(72) Inventor: Chandler Chen, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 357 days.

(21) Appl. No.: 14/956,161

(22) Filed: Dec. 1, 2015

(65) Prior Publication Data
US 2016/0156343 A1 Jun. 2, 2016

(30) Foreign Application Priority Data
Dec. 1, 2014 (CN) .......................... 2014 1 0720399

(51) Int. Cl.
*H03K 17/082* (2006.01)
*H02H 3/20* (2006.01)
*H02H 9/04* (2006.01)

(52) U.S. Cl.
CPC ........... *H03K 17/0822* (2013.01); *H02H 3/20* (2013.01); *H02H 9/043* (2013.01); *H03K 17/082* (2013.01)

(58) Field of Classification Search
CPC .... H03K 17/082; H03K 17/0822; H02H 3/20; H02H 9/043
See application file for complete search history.

(56) References Cited

U.S. PATENT DOCUMENTS

| | | | | |
|---|---|---|---|---|
| 4,504,777 A * | 3/1985 | Bauer | ................... | H02M 3/135 323/242 |
| 8,472,157 B2 * | 6/2013 | Yin | .......................... | H02H 3/20 361/79 |
| 2001/0020803 A1 * | 9/2001 | Maru | ...................... | H02J 1/102 307/87 |
| 2007/0159151 A1 * | 7/2007 | Katoh | ................... | H02M 3/156 323/285 |
| 2009/0109587 A1 * | 4/2009 | Smith | .................... | H02H 3/202 361/86 |
| 2013/0021701 A1 * | 1/2013 | Yin | .......................... | H02H 3/08 361/79 |
| 2016/0157313 A1 * | 6/2016 | Sykes | ................ | H05B 33/0809 315/254 |

* cited by examiner

*Primary Examiner* — Zeev V Kitov
(74) *Attorney, Agent, or Firm* — Perkins Coie LLP

(57) ABSTRACT

An over-voltage protection circuit for a transistor switch has an error detecting circuit, a dummy load circuit and a driving circuit. The error detecting circuit has a first input terminal; and a second input terminal configured to receive a reference signal. The dummy load circuit is configured to establish a conductive path between the output terminal of the transistor switch and ground. The driving circuit is configured to increase the on-resistance of the transistor switch if the voltage difference between the second terminal of the error detecting circuit and the first terminal of the error detecting circuit is smaller than a calculated value.

18 Claims, 2 Drawing Sheets

US 10,050,615 B2

OVER-VOLTAGE PROTECTION CIRCUIT AND ASSOCIATED METHOD

CROSS-REFERENCE TO RELATED APPLICATIONS

This application claims priority to and the benefit of Chinese Patent Application No. 201410720399.0, filed on Dec. 1, 2014, which is incorporated herein by reference in its entirety.

TECHNICAL FIELD

The present invention generally relates to electronic apparatuses, and more particularly but not exclusively to over-voltage protection circuit for transistor switch.

BACKGROUND

Transistors are often used as switches in electronic circuits, such as a USB switch. FIG. 1 shows a schematic diagram of a prior art electronic switching system 10. Electronic switching system 10 comprises a NMOS transistor switch N1, a switch S1, a current source I1, and an output capacitor CO. The transistor N1 has an input terminal IN, an output terminal OUT and a control terminal CTL, wherein the input terminal receives an input voltage VIN, and wherein the output terminal provides an output voltage VOUT. The switch S1 has a first terminal and a second terminal, wherein the first terminal is coupled to the control terminal CTL of the transistor N1, and wherein the second terminal is coupled to ground (GND). The first current source I1 has a first terminal and a second terminal, wherein the first terminal is coupled to a first power supply terminal SP1, and wherein the second terminal is coupled to the control terminal CTL of the transistor N1. The output capacitor CO has a first terminal and a second terminal, wherein the first terminal is coupled to the output terminal OUT of the transistor N1, and wherein the second terminal is coupled to ground GND. The first power supply terminal SP1 normally receives a first voltage VSP higher than the input voltage VIN to make the transistor N1 be completely turned on, such as VSP=VIN+5, or VSP=2×VIN that is provided by a 2 times charge pump. When the first switch S1 is turned on, the control terminal CTL of the transistor N1 is at a low potential, and the transistor N1 is turned off. When the first switch S1 is turned off, the first current source I1 pulls the control terminal CTL of the transistor N1 to the first voltage VSP, which makes the transistor N1 be completely turned on, and the output voltage VOUT is approximately equal to the input voltage VIN.

Since the USB protocol is a standard protocol, the input voltage VIN is relatively stable, around 5V. But, due to device failure or external power supply varying, the input voltage VIN and the output voltage VOUT may raise, which will be very easy to damage the external USB device coupled to be output terminal OUT of the transistor switch N1. So it is necessary to provide an over-voltage protection circuit for a transistor switch and USB interface related circuits.

SUMMARY

Embodiments of the present invention are directed to an over-voltage protection circuit for a transistor switch, wherein the transistor switch has a control terminal, an input terminal receiving an input voltage and an output terminal providing an output voltage, the protection circuit comprises: an error detecting circuit having a first input terminal, a second input terminal and an output terminal, wherein the first input terminal is coupled to the output terminal of the transistor switch, and wherein the second input terminal is configured to receive a reference signal, and wherein based on the reference signal and the output voltage, the error detecting circuit provides an amplified error signal at the output terminal; a dummy load circuit having a control terminal, a first terminal and a second terminal, wherein the control terminal is coupled to the output terminal of the error detecting circuit, and wherein the first terminal is coupled to the control terminal of the transistor switch, and wherein the second terminal is connected to ground, and wherein the dummy load circuit is configured to establish a conductive path between the output terminal of the transistor switch and ground if a voltage difference between the second terminal of the error detecting circuit and the first terminal of the error detecting circuit is smaller than a second value; and a driving circuit having an input terminal and an output terminal, wherein the input terminal is coupled to the output terminal of the error detecting circuit, and wherein the output terminal is coupled to the control terminal of the transistor switch, and wherein the driving circuit is configured to increase the on-resistance of the transistor switch if the voltage difference between the second terminal of the error detecting circuit and the first terminal of the error detecting circuit is smaller than a first value, and wherein the second value is larger than the first value.

Furthermore, there has been provided, in accordance with an embodiment of the present invention, an over-voltage protection method for a transistor switch, wherein the transistor switch has a control terminal, an input terminal receiving an input voltage and an output terminal providing an output voltage, the protection method comprises, the protection method comprises: establishing a conductive path between the output terminal and ground if the output voltage is greater than a first threshold; and increasing the on-resistance of the transistor switch if the output voltage is greater than a second threshold, wherein the second threshold is greater than the first threshold.

BRIEF DESCRIPTION OF THE DRAWINGS

Non-limiting and non-exhaustive embodiments are described with reference to the following drawings. The drawings are only for illustration purpose. Usually, the drawings only show part of the devices of the embodiments. These drawings are not necessarily drawn to scale. The relative sizes of elements illustrated by the drawings may differ from the relative size depicted.

DETAILED DESCRIPTION

In the present invention, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
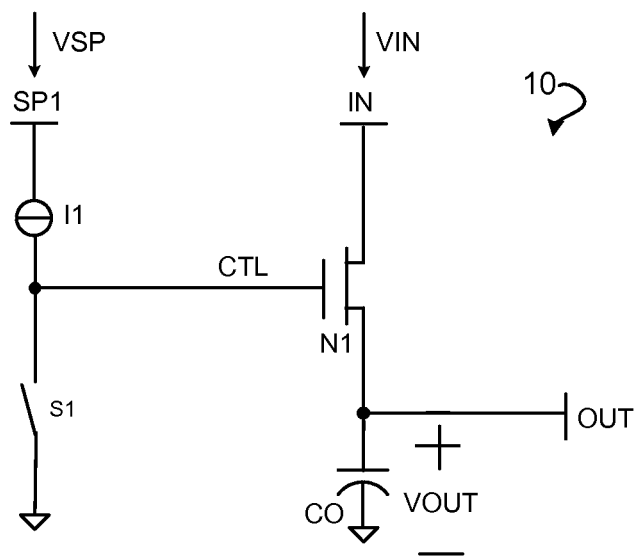
FIG. 1 schematically illustrates a prior art electronic switching system 10.
Figure 2:
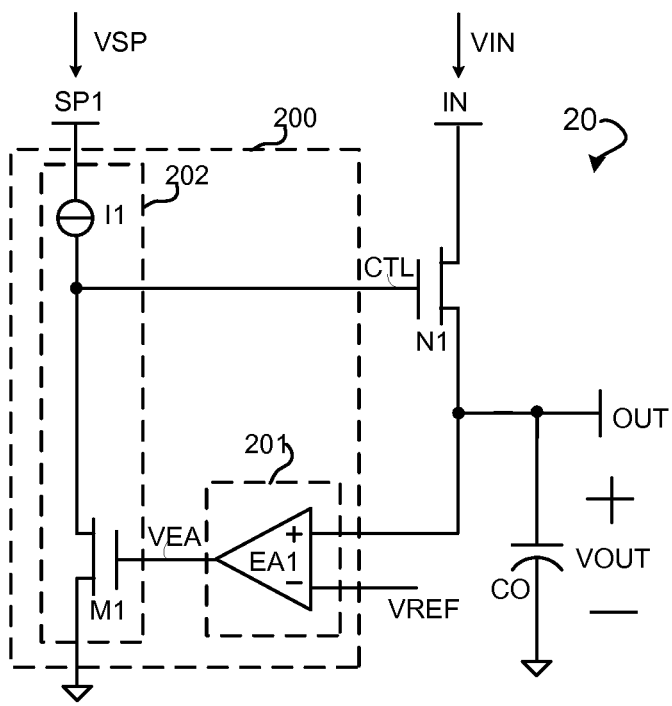
FIG. 2 schematically illustrates an electronic switching system 20 in accordance with an exemplary embodiment of the present invention.

FIG. 2 schematically illustrates an electronic switching system 20 in accordance with an exemplary embodiment of the present invention. Electronic switching system 20 comprises a NMOS transistor N1 and an over-voltage protection circuit 200. The over-voltage protection circuit 200 comprises an error detecting circuit 201 and a driving circuit 202.

The error detecting circuit 201 has a first input terminal, a second input terminal and an output terminal, wherein the first input terminal is coupled to the output terminal OUT of the transistor switch N1, and wherein the second input terminal is configured to receive a reference signal VREF, and wherein based on the reference signal VREF and the output signal VOUT, the error detecting circuit 201 provides an amplified error signal VEA at the output terminal. In one embodiment, the error detecting circuit 201 comprises an error amplifier EA1. The driving circuit 202 comprises a first transistor M1 and a first current source I1. The first transistor M1 has a control terminal, a first terminal and a second terminal, wherein the control terminal is coupled to the output terminal of the error detecting circuit 201, and wherein the first terminal is coupled to control terminal CTL of the transistor switch N1, and wherein the second terminal is coupled to ground GND. The first current source I1 has a first terminal and a second terminal, wherein the first terminal is coupled to a first power terminal SP1 for receiving a first voltage VSP, and wherein the second terminal is coupled to the first terminal of the first transistor M1.

When the input voltage VIN is small, the output voltage VOUT is far lower than the reference voltage VREF, and the amplified error signal VEA is at a low potential. The first transistor M1 is turned off, and the first current source I1 pulls the voltage level on control terminal CTL of the transistor switch N1 to the first voltage VSP. The transistor N1 remains being fully turned on.

When the input voltage VIN increases, the output voltage VOUT gradually increases to the reference voltage VREF, and the first transistor M1 is gradually turned on. The voltage of the control terminal CTL of the transistor N1 is reduced, while the on-resistance of the transistor switch N1 increases, so that the output voltage VOUT is clamped around to the reference voltage VREF. In a word, the transistor switch N1, the error detecting circuit 201 and the driving circuit 202 constitute a negative feedback loop (NFL) configured to clamp the output voltage VOUT around to the reference voltage VREF.

The NFL has a main pole and two sub poles. Usually the main pole is located at the control terminal CTL of the transistor N1, and the sub poles are located at the output terminal OUT of the transistor switch N1 (a first sub-pole) and the output terminal of the error detecting circuit 201 (a second sub-pole). To obtain a stabilize NFL, the two sub-poles should be set to high frequencies. The second sub-pole could be set to a high frequency by reducing the output resistance or the voltage gain of the error detecting circuit 201. In an embodiment, the voltage gain of the error amplifier EA1 is set to be lower than 100, preferably 10 to 20 times. Under heavy load, since the equivalent output resistance is very small, the first sub-pole locates in a high frequency. But, under light load, since the equivalent output resistance is very large, the first sub-pole would be locate in a low frequency, which would cause the electronic switching system 20 unstable.

Figure 3:
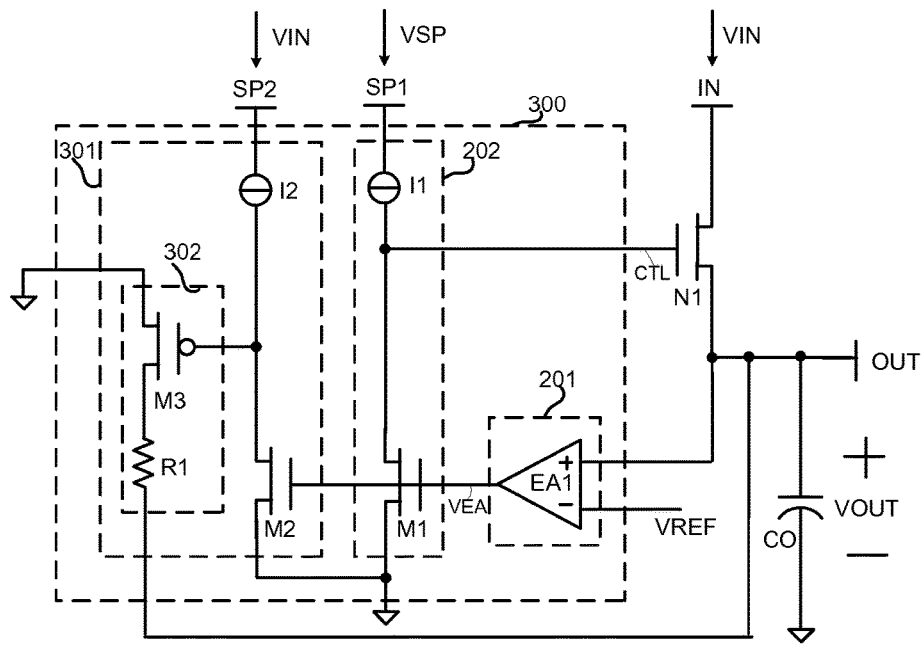
FIG. 3 schematically illustrates an electronic switching system 30 in accordance with an exemplary embodiment of the present invention.

FIG. 3 schematically illustrates an electronic switching system 30 in accordance with an exemplary embodiment of the present invention. Electronic switching system 30 comprises the NMOS transistor N1 and an over-voltage protection circuit 300. The over-voltage protection circuit 300 comprises the error detecting circuit 201, the driving circuit 202 and a dummy load circuit 301. The dummy load circuit 301 has a control terminal, a first terminal and a second terminal, wherein the control terminal is coupled to the output terminal of the error detecting circuit 201, and wherein the first terminal is coupled to the control terminal CTL of the transistor switch N1, and wherein the second terminal is coupled to ground GND, and wherein the dummy load circuit is configured to establish a conductive path between the output terminal of the transistor switch and ground if the voltage difference VDIF between the second terminal of the error detecting circuit 201 and the first terminal of the error detecting circuit 201 is smaller than a second value DIFF2.

The first terminal of the error detecting circuit 201 may be directly connected to the output terminal OUT of the transistor switch N1, or it may also be able to be coupled to the output terminal OUT of the transistor switch N1 via a resistor divider. For simplicity, it is assuming that the first terminal of the error detecting circuit 201 is directly connected to the output terminal OUT of the transistor switch N1 in the following descriptions.

When the input voltage VIN is small, the output voltage VOUT is far lower than the reference voltage VREF, and the amplified error signal VEA is at a low potential. The first transistor M1 is turned off, and the first current source I1 pulls the voltage level on the control terminal CTL of the transistor switch N1 to the first voltage VSP. The transistor N1 remains being fully turned on.

When the power supply voltage VIN increases, the output voltage VOUT is gradually increased too. When the output voltage VOUT is increased to a first threshold voltage (e.g. VOUT=VREF−0.01), i.e., when the voltage difference VDIF between the second terminal of the error detecting circuit 201 and the first terminal of the error detecting circuit 201 is smaller than a second value DIFF2 (e.g. 10 mV, i.e. VREF−VOUT=0.01), the dummy load circuit 301 establishes a conductive path between the output terminal OUT and ground GND, so as to reduce the equivalent output resistance. Normally, the on-resistance of the conductive path is several ten ohms, preferably 10 to 100 ohm.

The output voltage VOUT continues increasing as the input voltage VIN increases. When the output voltage VOUT increases to a second threshold voltage (e.g. VOUT=VREF−0.005), i.e., when the voltage difference VDIF between the second terminal of the error detecting circuit 201 and the first terminal of the error detecting circuit 201 is smaller than a first value DIFF1 (e.g., 5 mv, VREF−VOUT=0.005), the driving circuit 202 increases the on-resistance of the transistor switch N1, so that the output voltage VOUT is clamped around to the VREF. Since the output equivalent resistance is reduced by the dummy load circuit 301, the first sub-pole is pushed to a high frequency. The negative feedback loop comprising the transistor switch N1, the error detecting circuit 201, the driving circuit 202 and the dummy load circuit 301 would be stable and could quickly clamp the output voltage VOUT around to the reference voltage VREF. Since the error amplifier EA1 is a low gain amplifier, the output voltage VOUT may exceed the reference voltage VREF, and the voltage difference VDIF between the second terminal of the error detecting circuit 201 and the first terminal of the error detecting circuit 201 may be negative.

According to one embodiment of the present invention, the dummy load circuit 301 comprises a second transistor M2, a second current source I2 and a discharge circuit 302. The second transistor M2 has a control terminal, a first terminal and a second terminal, wherein the control terminal is coupled to the output terminal of the error detecting circuit 201, and wherein the second terminal is coupled to ground GND. The second current source I2 has a first terminal and a second terminal, wherein the first terminal is coupled a second power terminal SP2, and wherein the second terminal is coupled to the first terminal of the second transistor M2. The second power terminal SP2 could receives the input voltage VIN or the first power supply VSP. The discharge circuit 302 has a control terminal, a first terminal and a second terminal, wherein the control terminal is coupled to a second terminal of the second current source I2, and wherein the first terminal is coupled to ground, and wherein the second terminal is coupled to the output terminal CTL of the transistor switch N1.

In one embodiment, the discharge circuit 301 comprises a first resistor R1 and a third transistor M3. The first resistor R1 has a first terminal and a second terminal, wherein the first terminal is coupled to the output terminal OUT of the transistor switch N1. The third transistor M3 has a control terminal, a first terminal and a second terminal, wherein the control terminal is coupled to the second terminal of the second current source I2, and wherein the first terminal is coupled to ground, and wherein the second terminal is coupled to the second terminal of the first resistor R1. In an embodiment, to obtain a more perfect digital signal, several inverters could be inserted between the control terminal of the third transistor M3 and the second terminal of the second current source I2.

The one skilled in this art should understand that the first value DIFF1 and the second value DIFF2 may be set based on the voltage gain of the error detecting circuit 201, the first current source I1, the second current source I2, the first transistor M1, the second transistor M2. In one embodiment, to ensure that the first value DIFF1 is less than the second value DIFF2, i.e., to ensure that the dummy load circuit 301 reduces the equivalent output resistance before the driving circuit 202 increases the on-resistance of the transistor switch N1, the following methods could be used: i) if the size of the first transistor M1 matches with the size of the second transistor M2, the current of the first current source I1 is larger than the current of the second current source I2; and ii) if the generated currents from the first current source I1 and the second current source I2 are equal, the channel width of the first transistor M1 is narrower than channel width of the second transistor M2.

Figure 4:
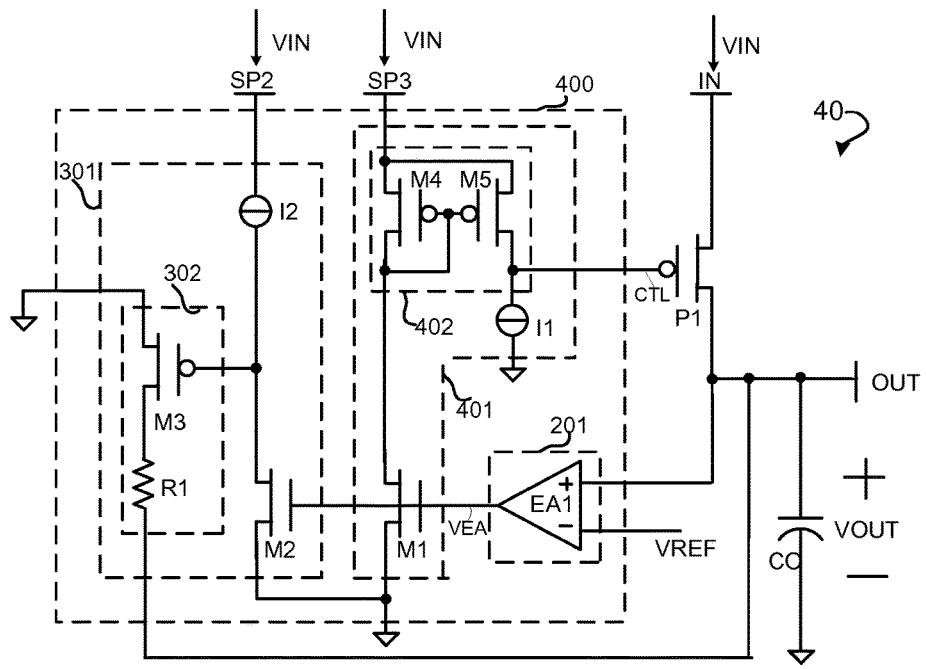
FIG. 4 schematically illustrates an electronic switching system 40 in accordance with an exemplary embodiment of the present invention.

The invention can be used not only for the NMOS transistor switch, but also for the PMOS transistor switch, PNP transistor switch, NPN transistor switch, and so on. FIG. 4 schematically illustrates an electronic switching system 40 in accordance with an exemplary embodiment of the present invention. Electronic switching system 40 comprises a PMOS transistor switch P1 and an over-voltage protection circuit 400. The transistor P1 has an input terminal IN, an output terminal OUT and a control terminal CTL, wherein the input terminal receives an input voltage VIN and the output terminal provides an output voltage VOUT. The over-voltage protection circuit 400 comprises the error detecting circuit 201, a driving circuit 401 and the dummy load circuit 301. The driving circuit 401 comprises a first transistor M1, a first current mirror 402 and a first current source I1.

The first transistor M1 has a control terminal, a first terminal and a second terminal, wherein the control terminal is coupled to the output terminal of the error detecting circuit 201, and wherein the second terminal is coupled to ground. The current mirror 402 has a power terminal, a first terminal and a second terminal, wherein the power terminal is coupled to a third power terminal, and wherein the first terminal is coupled to first terminal of the first transistor M1, and wherein the second terminal is coupled to the control terminal CTL of the transistor switch P1. In one embodiment, the third power supply terminal SP3 receives an input voltage VIN. The first current source I1 has a first terminal and a second terminal, wherein the first terminal is coupled to the control terminal CTL of the transistor switch P1, and wherein the second terminal is coupled to ground.

In an embodiment, the first current mirror 402 comprises a fourth transistor M4 and a fifth transistor M5. The fourth transistor M4 has a control terminal, a first terminal and a second terminal, wherein the control terminal and the second terminal are coupled to the first terminal of the first current mirror 402, and wherein the first terminal is coupled to the power terminal of the first current mirror 402. The fifth transistor M5 has a control terminal, a first terminal and a second terminal, wherein the control terminal is coupled to the control terminal of the fourth transistor M4, and wherein the first terminal is coupled to the power terminal of the first current mirror 402, and wherein the second terminal is coupled to the second terminal of the first current mirror 402.

The working principle of the over-voltage protection circuit 400 is similar with the over-voltage protection circuit 300's. When the output voltage VOUT is increased to a first threshold voltage (e.g. VOUT=VREF−0.01), i.e., when the voltage difference VDIF between the second terminal of the error detecting circuit 201 and the first terminal of the error detecting circuit 201 is smaller than a second value DIFF2 (e.g. 10 mV, VREF−VOUT=0.01), the dummy load circuit 301 establishes a conductive path between the output terminal OUT and ground GND, so as to reduce the equivalent output resistance. When the output voltage VOUT increases to a second threshold voltage (e.g. VOUT=VREF−0.01), i.e., when the voltage difference VDIF between the second terminal of the error detecting circuit 201 and the first terminal of the error detecting circuit 201 is smaller than a first value DIFF1 (e.g. 5 mv, VREF−VOUT=0.005), the driving circuit 401 increases on-resistance of the transistor switch P1 by pulling the voltage level on the control terminal CTL of the transistor switch P1, so that the output voltage VOUT is clamped to be around the VREF.

The present invention also provides an over-voltage protection method for a transistor switch N1, wherein the transistor N1 has a control terminal CTL, an input terminal IN and an output terminal OUT, and wherein the input terminal IN receives an input voltage VIN, and wherein the output terminal OUT provides an output voltage VOUT, the protection method comprising: establishing a conductive path between the output terminal OUT and ground GND if the output voltage VOUT is greater than a first threshold VTH1; and increasing the on-resistance of the transistor switch N1 if the output voltage VOUT is greater than a second threshold VTH2, wherein the second threshold is greater than the first threshold VTH1.

According to an embodiment of the present invention, the transistor switch N1 is a main switch of an USB switch.

According to an embodiment of the present invention, the on-resistance of the conductive path is from 10 to 100 ohm.

According to an embodiment of the present invention, the transistor switch N1 is fully turned on if the output voltage VOUT is smaller than the first threshold VTH1.

According to an embodiment of the present invention, the output voltage VOUT is clamped to a pre-set value VSET. Normally, the voltage difference between the pre-set value VSET and second threshold VTH2 would be tens of millivolts.

Over-voltage protection circuits and associate methods for transistor switch have been disclosed. While specific embodiments of the present invention have been provided in the above description, it should be understood that these embodiments are for illustration purposes and not intended to limit the present invention. Many additional embodiments will be apparent to persons of ordinary skill in the art under the spirit of the present invention.

What is claimed is:

1. An over-voltage protection circuit for a transistor switch, wherein the transistor switch has a control terminal, an input terminal receiving an input voltage and an output terminal providing an output voltage, the protection circuit comprises:
    an error detecting circuit having a first input terminal, a second input terminal and an output terminal, wherein the first input terminal is coupled to the output terminal of the transistor switch, and wherein the second input terminal is configured to receive a reference signal, and wherein based on the reference signal and the output voltage, the error detecting circuit provides an amplified error signal at the output terminal;
    a dummy load circuit having a control terminal, a first terminal and a second terminal, wherein the control terminal is coupled to the output terminal of the error detecting circuit, and wherein the first terminal is coupled to the output terminal of the transistor switch, and wherein the second terminal is connected to ground, and wherein the dummy load circuit is configured to establish a conductive path between the output terminal of the transistor switch and ground if a voltage difference between the second terminal of the error detecting circuit and the first terminal of the error detecting circuit is smaller than a second value; and
    a driving circuit having an input terminal and an output terminal, wherein the input terminal is coupled to the output terminal of the error detecting circuit, and wherein the output terminal is coupled to the control terminal of the transistor switch, and wherein the driving circuit is configured to increase the on-resistance of the transistor switch if the voltage difference between the second terminal of the error detecting circuit and the first terminal of the error detecting circuit is smaller than a first value, and wherein the second value is larger than the first value.

2. The protection circuit according to claim 1, wherein the error detecting circuit comprises an error amplifier, and wherein the voltage gain of the error amplifier is smaller than 100.

3. The protection circuit according to claim 1, wherein the transistor switch comprises an NMOS, and wherein the driving circuit comprises:
    a first transistor having a control terminal, a first terminal and a second terminal, wherein the control terminal is coupled to the output terminal of the error detecting circuit, and wherein the first terminal is coupled to the control terminal of the transistor switch, and wherein the second terminal is connected to ground; and
    a first current source having a first terminal and a second terminal, wherein the first terminal is coupled to a first power terminal, and wherein the second terminal is coupled to the first terminal of the first transistor.

4. The protection circuit according to claim 3, wherein the first power terminal is configured to receive a first voltage, and wherein the first voltage is higher than the input voltage.

5. The protection circuit according to claim 3, wherein the dummy load circuit comprises:
    a second transistor having a control terminal, a first terminal and a second terminal, wherein the control terminal is coupled to the output terminal of the error detecting circuit, and wherein the second terminal is connected to ground;
    a second current source having a first terminal and a second terminal, wherein the first terminal is configured to receive the input voltage, and wherein the second terminal is coupled to the first terminal of the second transistor; and
    a discharge circuit having a control terminal, a first terminal and a second terminal, wherein the control terminal is coupled to a second terminal of the second current source, and wherein the first terminal is connected to ground, and wherein the second terminal is coupled to the output terminal of the transistor switch.

6. The protection circuit according to claim 5, wherein the discharge circuit comprises:
    a first resistor having a first terminal and a second terminal, wherein the first terminal is coupled to the output terminal of the transistor switch; and
    a third transistor having a control terminal, a first terminal and a second terminal, wherein the control terminal is coupled to the second terminal of the second current source, and wherein the first terminal is connected to ground, and wherein the second terminal is coupled to the second terminal of the first resistor.

7. The protection circuit according to claim 5, wherein:
    if the size of the first transistor matches the size of the second transistor, a current generated by the first current source is larger than a current generated by the second current source; and
    if the currents generated by the first current source and the second current source are equal, the channel width of the first transistor is narrower than the channel width of the second transistor.

8. The protection circuit according to claim 1, wherein the transistor switch comprises a PMOS, and wherein the driving circuit comprises:
    a first transistor having a control terminal, a first terminal and a second terminal, wherein the control terminal is coupled to the output terminal of the error detecting circuit, and wherein the second terminal is connected to ground;
    a current mirror having a power terminal, a first terminal and a second terminal, wherein the power terminal is configured to receive the input voltage, and wherein the first terminal is coupled to first terminal of the first transistor, and wherein the second terminal is coupled to the control terminal of the transistor switch; and
    a first current source having a first terminal and a second terminal, wherein the first terminal is coupled to the control terminal of the transistor switch, and wherein the second terminal is connected to ground.

9. The protection circuit according to claim 8, wherein the dummy load circuit comprises:

a second transistor having a control terminal, a first terminal and a second terminal, wherein the control terminal is coupled to the output terminal of the error detecting circuit, and wherein the second terminal is connected to ground;

a second current source having a first terminal and a second terminal, wherein the first terminal is configured to receive the input voltage, and wherein the second terminal is coupled to the first terminal of the second transistor; and a discharge circuit having a control terminal, a first terminal and a second terminal, wherein the control terminal is coupled to a second terminal of the second current source, and wherein the first terminal is connected to ground, and wherein the second terminal is coupled to the output terminal of the transistor switch.

10. The protection circuit according to claim 9, wherein:

if the size of the first transistor matches the size of the second transistor, a current generated by the first current source is larger than a current generated by the second current source; and if the currents generated by the first current source and the second current source are equal, the channel width of the first transistor is narrower than the channel width of the second transistor.

11. The protection circuit according to claim 9, wherein the discharge circuit comprises:

a first resistor having a first terminal and a second terminal, wherein the first terminal is coupled to the output terminal of the transistor switch; and a third transistor having a control terminal, a first terminal and a second terminal, wherein the control terminal is coupled to the second terminal of the second current source, and wherein the first terminal is connected to ground, and wherein the second terminal is coupled to the second terminal of the first resistor.

12. The protection circuit according to claim 8, wherein the first current mirror comprises:

a fourth transistor having a control terminal, a first terminal and a second terminal, wherein the control terminal and the second terminal are both coupled to the first terminal of the first current mirror, and wherein the first terminal is coupled to the power terminal of the first current mirror; and a fifth transistor having a control terminal, a first terminal and a second terminal, wherein the control terminal is coupled to the control terminal of the fourth transistor, and wherein the first terminal is coupled to the power terminal of the first current mirror, and wherein the second terminal is coupled to the second terminal of the first current mirror.

13. The protection circuit according to claim 1, wherein if the voltage difference between the second terminal of the error detecting circuit and the first terminal of the error detecting circuit is greater than the second value, the transistor switch will be fully turned on; and if the voltage difference between the second terminal of the error detecting circuit and the first terminal of the error detecting circuit is smaller than the first value, the output voltage will be clamped to a pre-set value.

14. The protection circuit according to claim 1, wherein the transistor switch is a main switch of an USB switch.

15. An over-voltage protection method for a transistor switch, wherein the transistor has a control terminal, an input terminal receiving an input voltage and an output terminal providing an output voltage, the protection method comprises:

establishing a conductive path between the output terminal and ground if the output voltage is greater than a first threshold; and increasing the on-resistance of the transistor switch if the output voltage is greater than a second threshold, wherein the second threshold is greater than the first threshold; wherein if the output voltage exceeds the second threshold, the output voltage will be clamped to a pre-set value.

16. The protection method according to claim 15, wherein the transistor switch is a main switch of an USB switch.

17. The protection method according to claim 15, wherein the on-resistance of the conductive path is from 10 to 100 ohm.

18. The protection method according to claim 15, wherein the transistor switch is fully turned on if the output voltage is smaller than the first threshold.

* * * * *